United States Patent
Wang et al.

(10) Patent No.: US 11,917,775 B2
(45) Date of Patent: Feb. 27, 2024

(54) FOLDABLE DISPLAY DEVICE AND FLEXIBLE DISPLAY ASSEMBLY

(71) Applicants: Chengdu BOE Optoelectronics Technology Co., Ltd., Sichuan (CN); BOE Technology Group Co., Ltd., Beijing (CN)

(72) Inventors: Jiaxiang Wang, Beijing (CN); Yonghui Luo, Beijing (CN); Binfeng Feng, Beijing (CN); Zijie Zhang, Beijing (CN); Fei Li, Beijing (CN); Bowen Xiao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 283 days.

(21) Appl. No.: 17/418,783

(22) PCT Filed: Nov. 17, 2020

(86) PCT No.: PCT/CN2020/129462
§ 371 (c)(1),
(2) Date: Jun. 26, 2021

(87) PCT Pub. No.: WO2021/184798
PCT Pub. Date: Sep. 23, 2021

(65) Prior Publication Data
US 2022/0322547 A1     Oct. 6, 2022

(30) Foreign Application Priority Data
Mar. 18, 2020   (CN) .......................... 202020346047.4

(51) Int. Cl.
*H05K 5/02*    (2006.01)
*H05K 5/00*    (2006.01)

(52) U.S. Cl.
CPC ......... *H05K 5/0217* (2013.01); *H05K 5/0017* (2013.01)

(58) Field of Classification Search
CPC .... G06F 1/1616; G06F 1/1618; G06F 1/1626; G06F 1/1641; G06F 1/1652;
(Continued)

(56) References Cited

U.S. PATENT DOCUMENTS 9,204,565 B1 *  12/2015  Lee .................... E05F 1/1016
10,509,441 B2 * 12/2019  Wu ..................... H04M 1/0268
(Continued)

FOREIGN PATENT DOCUMENTS

CN    103914273 A    7/2014
CN    107102692 A    8/2017
(Continued)

OTHER PUBLICATIONS

International Search Report for PCT/CN2020/129462 dated Feb. 19, 2021.

*Primary Examiner* — Rockshana D Chowdhury
*Assistant Examiner* — Martin Antonio Asmat Uceda
(74) *Attorney, Agent, or Firm* — Ling Wu; Stephen Yang; Ling and Yang Intellectual Property

(57) ABSTRACT

A foldable display device and a flexible display assembly are provided. The foldable display device includes a casing frame, a flexible display module arranged on the casing frame, and a pull-back device; the casing frame includes a first frame body and a second frame body hinged with the first frame body, and a hinged portion between the first and second frame bodies corresponds to a bending area of the flexible display module; a support plate is arranged on one side of the flexible display module facing away from a display side, the support plate is arranged close to a first end of the flexible display module and is slidably connected to
(Continued)

A-A the second frame body, and a portion of the flexible display module close to a second end is fixed on the first frame body; the pull-back device is arranged between the support plate and the second frame body.

18 Claims, 5 Drawing Sheets

(58) Field of Classification Search
CPC .. G06F 1/1681; H04M 1/0268; H05K 5/0017; H05K 5/0018
See application file for complete search history.

(56) References Cited

U.S. PATENT DOCUMENTS

| | | | |
|---|---|---|---|
| 2005/0269943 A1* | 12/2005 | Hack | H10K 77/111 |
| | | | 313/504 |
| 2014/0029171 A1* | 1/2014 | Lee | H04M 1/0268 |
| | | | 361/679.01 |
| 2014/0111954 A1* | 4/2014 | Lee | H04M 1/0268 |
| | | | 361/749 |
| 2016/0179229 A1* | 6/2016 | Ahn | G06F 3/041 |
| | | | 345/173 |
| 2018/0146560 A1 | 5/2018 | Chen et al. | |
| 2018/0150106 A1 | 5/2018 | Jang et al. | |
| 2019/0073002 A1 | 3/2019 | Wu et al. | |

FOREIGN PATENT DOCUMENTS

| | | |
|---|---|---|
| CN | 107464502 A | 12/2017 |
| CN | 108109527 A | 6/2018 |
| CN | 108122491 A | 6/2018 |
| CN | 210955912 U | 7/2020 |
| KR | 10-2019-0001864 A | 1/2019 |

* cited by examiner

A-A

FOLDABLE DISPLAY DEVICE AND FLEXIBLE DISPLAY ASSEMBLY

CROSS-REFERENCE TO RELATED APPLICATIONS

The present application is a U.S. National Phase Entry of International PCT Application PCT/CN2020/129462 having an international filing date of Nov. 17, 2020, which claims priority of Chinese Patent Application No. 2020203460474 entitled "Foldable Display Device" and filed to CNIPA on Mar. 18, 2020, the contents of which should be understood as being incorporated herein by reference.

TECHNICAL FIELD

Embodiments of the present application relate to, but are not limited to, the field of display technology, and more particularly, to a foldable display device and a flexible display assembly.

BACKGROUND

With the progressive development of display technology, mobile display devices such as mobile phones and smart wearable devices are more and more widely used. In order to ensure portability of display devices, foldable display devices have become a trend. However, in some technologies, after a foldable display device has been used for a long time, an arching phenomenon will occur in a bending area of a display screen in an unfolded state (the bending area takes on a bent shape when the display device is in a folded state), thereby affecting the appearance and usability of the display device.

SUMMARY

A summary of the subject matter described in detail in the present application will be provided below. The summary is not intended to limit the protection scope of the claims.

An embodiment of the present application provides a foldable display device including a casing frame, a flexible display module arranged on the casing frame, and a pull-back device. The casing frame includes a first and a second frame body hinged with the first frame body, and a hinged portion between the first and the second frame body corresponds to a bending area of the flexible display module. A support plate is arranged on one side of the flexible display module facing away from a display side, the support plate is arranged close to a first end of the flexible display module and is slidably connected to the second frame body, and a portion of the flexible display module close to a second end is fixed on the first frame body. The pull-back device is arranged between the support plate and the second frame body, and is configured to exert a force on the flexible display module for flattening the bending area of the flexible display module when the flexible display module is in an unfolded state.

An embodiment of the present application further provides a flexible display assembly configured to be assembled with a casing frame of a foldable display device. The flexible display assembly includes a flexible display module and a pull-back device, and the flexible display module includes a bending area which is configured to have a bent shape when the flexible display module is in a folded state. The flexible display module includes a flexible display panel, a substrate arranged on one side of the flexible display panel facing away from a display side, and a support plate fixed on one side of the substrate away from the display side of the flexible display panel. The support plate is located on one side of the bending area and is arranged close to a first end of the flexible display module, the support plate is configured to be slidably connected to the casing frame. A portion of the flexible display module close to a second end is configured to be fixedly connected to the casing frame. The pull-back device is arranged on the support plate and is configured to cooperate with the casing frame to exert a force on the flexible display module for flattening the bending area when the flexible display module is in an unfolded state.

Other aspects will become apparent upon reading and understanding the accompanying drawings and the detailed description.

BRIEF DESCRIPTION OF DRAWINGS

The accompanying drawings are intended to provide an understanding of embodiments of the present application and form a portion of the specification, and are intended to explain the solutions of the embodiments of the present application together with embodiments of the present application and do not constitute a limitation on the solutions of the embodiments of the present application.

REFERENCE SIGNS 1 casing frame, 101 first frame body, 1011 first bezel, 1012 fixed plate, 102 second frame body, 1021 second bezel, 1022 chute, 1023 position-limiting portion, 103 hinged portion, 104 hinge shaft;

2 flexible display module, 201 bending area of flexible display module, 202 support plate, 2021 first side of support plate, 203 substrate, 204 back film, 205 flexible display panel, 2051 binding area of flexible display panel, 206 polarizer, 207 cover plate, 208 double sided adhesive tape, 209 first adhesive layer, 230 protective adhesive, 2041 first back film, 2042 second back film, 2071 first cover plate, 2072 second adhesive layer, 2073 second cover plate, 2074 third adhesive layer, 2075 third cover plate;

3 pull-back device, 301 accommodation housing, 3011 guide hole, 3012 relief hole, 302 guide post, 3021 first end of guide post, 3022 second end of guide post, 3023 baffle ring, 303 elastic member.

DETAILED DESCRIPTION

Those of ordinary skill in the art should understand that modifications or equivalent substitutions may be made to solutions of embodiments of the present application without departing from the spirit and the scope of the solutions of embodiments of the present application, and should be covered by the scope of the claims of the present application.

Figure 1:
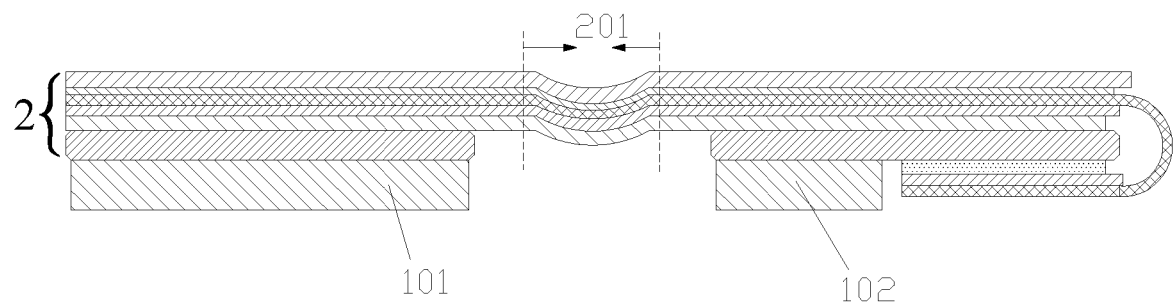
FIG. 1 is a schematic diagram of an assembly structure of a flexible display module and a casing frame of a foldable display device according to some technologies.

As shown in FIG. 1, in some technologies, a side of a flexible display module 2 of a foldable display device facing away from a display side is fixed on a casing frame of the display device. The casing frame includes a first frame body 101 and a second frame body 102 which are hinged, so that the display device can be folded. When the foldable display device is in a folded state, a creep phenomenon will occur in a bending area 201 of the flexible display module 2 due to a force exerted on it. After being used for a long time, an arching phenomenon will occur in the bending area 201 of the flexible display module 2 in an unfolded state (the bending area takes on a bent shape when the display device is in the folded state), thereby affecting the appearance and usability of the display device.

Figure 5:
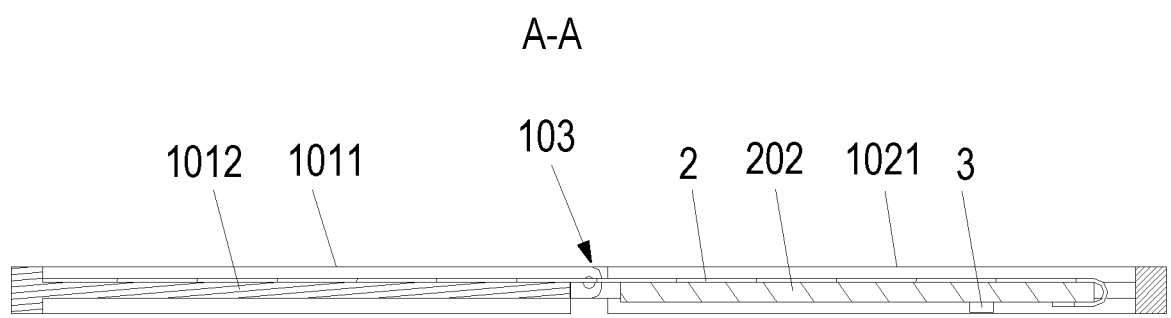
FIG. 5 is a sectional view taken along A-A of FIG. 4 according to some exemplary embodiments.

An embodiment of the present application provides a foldable display device, as shown in FIGS. 2 to 5, in some exemplary embodiments, the foldable display device includes a casing frame 1, a flexible display module 2 arranged on the casing frame 1, and a pull-back device 3 (shown in FIG. 5). The casing frame 1 includes a first frame body 101 and a second frame body 102 hinged with the first frame body 101, and a hinged portion 103 between the first frame body 101 and the second frame body 102 corresponds to a bending area 201 (an area between two dash lines in FIG. 4) of the flexible display module 2. A support plate 202 is arranged on one side of the flexible display module 2 facing away from a display side, the support plate 202 is arranged close to a first end of the flexible display module 2 and is slidably connected to the second frame body 102, and a portion of the flexible display module 2 close to a second end is fixed on the first frame body 101. The pull-back device 3 is arranged between the support plate 202 and the second frame body 102, and is configured to exert a force on the flexible display module 2 to flatten the bending area 201 of the flexible display module 2 when the flexible display module 2 is in the unfolded state.

In an embodiment of the present application, the first frame body 101 and the second frame body 102 can rotate relative to each other through the hinged portion 103, so that the display device can be switched between the folded state and the unfolded state. When the display device is in the folded state, the bending area 201 of the flexible display module 2 takes on the bent shape; and when the display device is in the unfolded state, the bending area 201 of the flexible display module 2 is flattened by the force of the pull-back device 3.

In the foldable display device according to an embodiment of the present application, the support plate 202 is arranged on one side of the flexible display module 2 facing away from the display side, the support plate 202 is slidably connected to the second frame body 102 of the casing frame 1, and the pull-back device 3 is arranged between the support plate 202 and the second frame body 102. Thus, when the flexible display module 2 is in the unfolded state, the pull-back device 3 can be configured to exert a force on the flexible display module 2 for flattening the bending area 201 of the flexible display module 2, so as to prevent an arching phenomenon from occurring in the bending area 201 of the flexible display module 2.

As shown in FIGS. 2 to 5, in some exemplary embodiments, the second frame body 102 includes two second bezels 1021 opposite to each other, and two sides of the support plate 202 are respectively disposed slidably in chutes 1022 (shown in FIG. 2) provided on the two second bezels 1021. In an example of the present embodiment, an edge contour of the casing frame 1 and an edge contour of the flexible display module 2 are both rectangular, and the second frame body 102 further includes a third bezel connected to an end of each of the two second bezels 1021, and the other end of each of the two second bezels 1021 is hinged with the first frame body 101. The opposite sides of the two second bezels 1021 are respectively each provided with a chute 1022 extending along a length direction of the second bezels 1021, and two ends of the chute 1022 can extend to two ends of the second bezels 1021 respectively.

Figure 9:
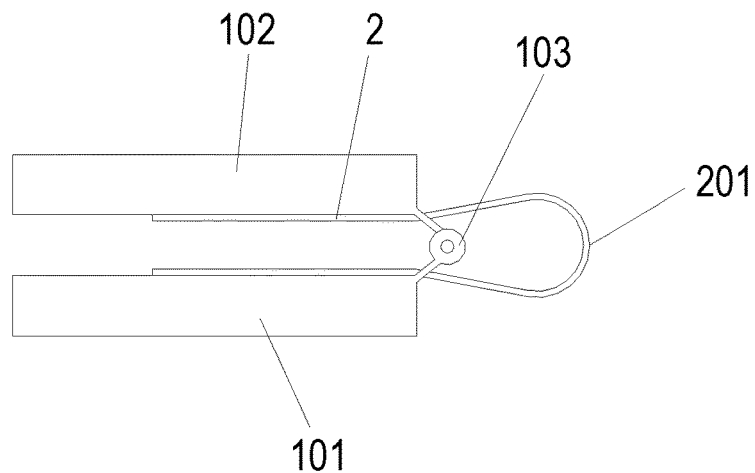
FIG. 9 is a schematic structural diagram of a foldable display device in a folded state according to some exemplary embodiments.

As shown in FIGS. 2 to 5, in some exemplary embodiments, the first frame body 101 includes two first bezels 1011 opposite to each other and a fixed plate 1012 arranged between the two first bezels 1011. The two first bezels 1011 are hinged with the two second bezels 1021 respectively, and the portion close to the second end on the side of the flexible display module 2 facing away from the display side is fixed (may be, but is not limited to being, bonded and fixed by a double-sided adhesive tape) on the fixed plate 1012. In an example of the present embodiment, the edge contour of the casing frame 1 and the edge contour of the flexible display module 2 are both rectangular. The first frame body 101 further includes a fourth bezel connected to an end of each of the two first bezels 1011, and the other ends of the two first bezels 1011 are respectively hinged with ends of the two second bezels 1021 through hinge shafts 104 (shown in FIG. 2). One end of the fixed plate 1012 is fixed on the fourth bezel, and there is a gap between the other end of the fixed plate 1012 and one end of the support plate 202 close to the first frame body 101, to avoid interference therebetween during the folding of the display device. In some exemplary embodiments, as shown in FIG. 9, when the display device is folded, the flexible display module 2 may be bent inwards for folding, and the display side of the flexible display module 2 is located inside the display device in the folded state.

Figure 2:
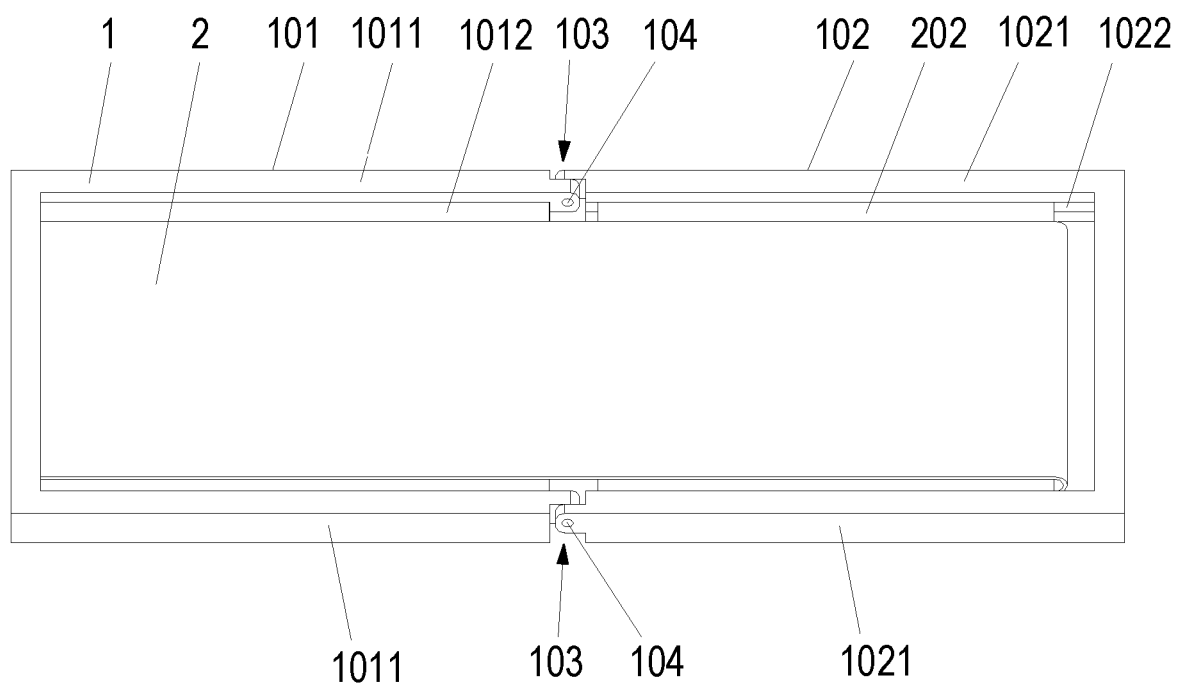
FIG. 2 is an assembly diagram of a flexible display module and a casing frame of a foldable display device according to some exemplary embodiments.
Figure 3:
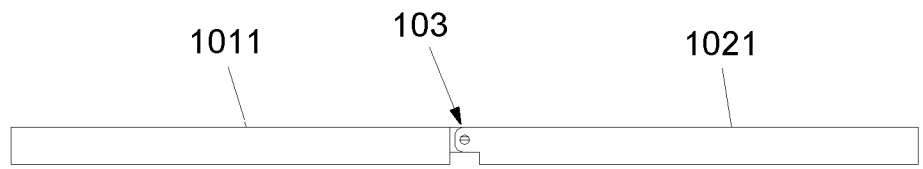
FIG. 3 is a schematic structural side view of the foldable display device of FIG. 2 according to some exemplary embodiments.
Figure 4:
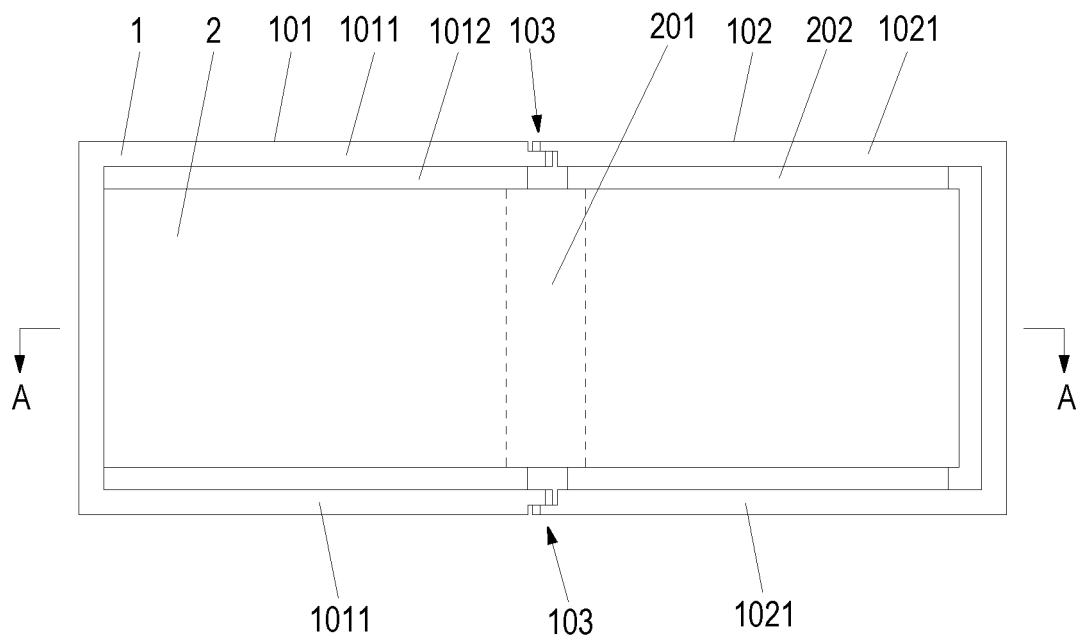
FIG. 4 is a schematic structural top view of the foldable display device of FIG. 2 according to some exemplary embodiments.

As shown in FIG. 2, in some exemplary embodiments, the chute 1022 is configured such that one end of the chute 1022 abuts against an end of the support plate 202 when the flexible display module 2 is in the folded state. Thus, an extreme position of sliding of the support plate 202 during the transition of the display device from the unfolded state to the folded state can be limited by position-limiting of the end of the chute 1022. In an example of the present embodiment, the support plate 202 can slide along the chute 1022 away from the hinged portion 103 during the transition of the display device from the unfolded state to the folded state; and the support plate 202 can slide along the chute 1022 towards the hinged portion 103 during transition of the display device from the folded state to the unfolded state.

As shown in FIGS. 5 to 8, in some exemplary embodiments, the support plate 202 includes a first side surface 2021 facing away from the display side of the flexible display module 2; and the pull-back device 3 includes a guide portion 309 and an abutting portion 310 arranged on the first side surface 2021 of the support plate 202, a guide post 302 slidably fitted with the guide portion 309, and an elastic member 303 arranged on the guide post 302. A position-limiting portion 1023 (shown in FIG. 8) is arranged on the second frame body 102, and the position-limiting portion 1023 is arranged to abut against a first end 3021 of the guide post 302 when the flexible display module 2 is in the unfolded state. The elastic member 303 is configured to be compressed and abut against the abutting portion 310 when the flexible display module 2 is in the unfolded state.

As shown in FIGS. 5 to 8, in an example of the present embodiment, the position-limiting portion 1023 can be disposed on a second bezel 1021 of the second frame body 102, for example, the position-limiting portion 1023 is disposed on a side surface of the second bezel 1021 provided with the chute 1022. The elastic member 303 may be a spring or a component with elastic deformation capability made of a flexible material (such as but not limited to rubber, etc.). During the transition of the display device from the folded state to the unfolded state (the folded state and the unfolded state of the display device correspond to the folded state and the unfolded state of the flexible display module 2), the support plate 202 slides along the chute 1022 towards one end (for example, one end of the chute 1022 close to the hinged portion 103) of the chute 1022, and the first end 3021 of the guide post 302 gradually approaches the position-limiting portion 1023, and abuts against the position-limiting portion 1023 before the display device is fully unfolded. After that, the display device continues to be unfolded. As the support plate 202 continues to slide along the chute 1022, the guide post 302 begins to slide relative to the guide portion 309, and the abutting portion 310 starts to abut against the elastic member 303 and press the elastic member 303, causing compression deformation of the elastic member 303 until the display device is fully unfolded (i.e., in the unfolded state). Thus, when the display device is in the unfolded state, the elastic member 303 is in a compressed state, and an elastic force of the elastic member 303 is exerted on the support plate 202 of the flexible display module 2, so that the bending area 201 of the flexible display module 2 can be flattened under the action of the elastic force (which may be a tensile force for the flexible display module 2) of the elastic member 303. During the transition of the display device from the unfolded state to the folded state (for example, the folded state shown in FIG. 9), the support plate 202 slides along the chute 1022 towards the other end of the chute 1022 (for example, one end of the chute 1022 away from the hinged portion 103), the first end 3021 of the guide post 302 is disengaged from and gradually moves away from the position-limiting portion 1023, and the elastic member 303 gradually returns to its initial state (which may be a natural state).

Figure 7:
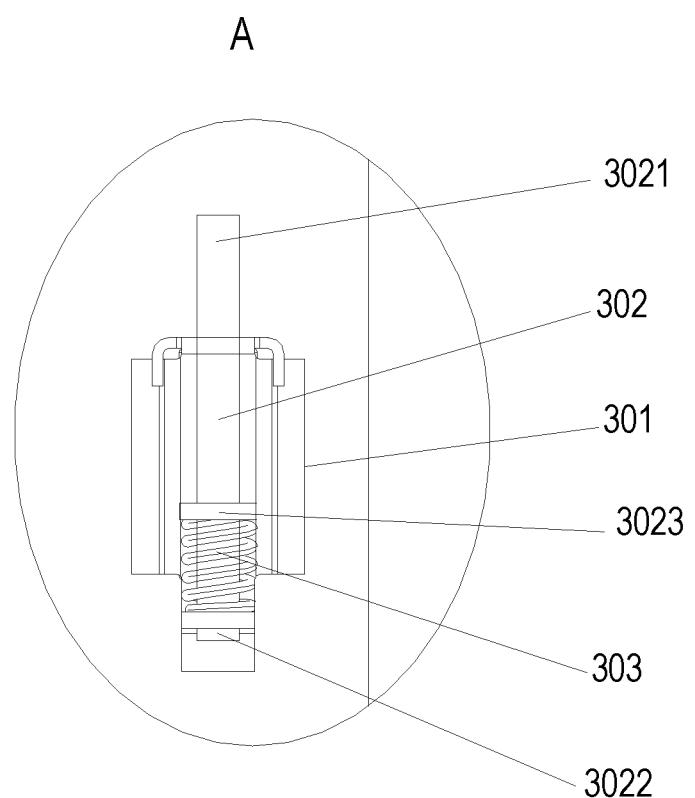
FIG. 7 is a partially enlarged view at A in FIG. 6 according to some exemplary embodiments.
Figure 8:
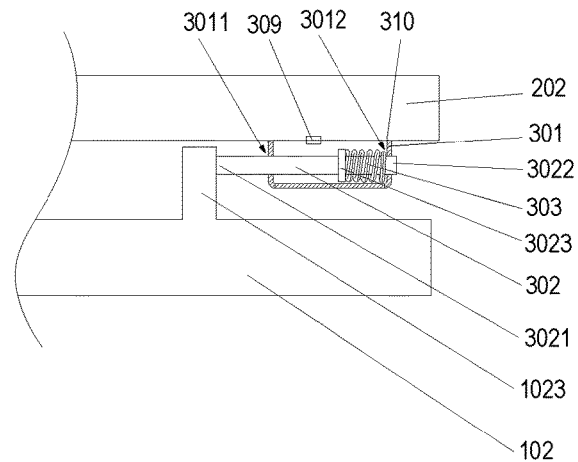
FIG. 8 is a state diagram of a pull-back device of the foldable display device of FIG. 2 in an unfolded state according to some exemplary embodiments.

As shown in FIGS. 7 and 8, in some exemplary embodiments, the pull-back device 3 includes an accommodation housing 301 disposed on the first side surface 2021 of the support plate 202. The accommodation housing 301 includes the guide portion 309 and the abutting portion 310. A guide hole 3011 slidably fitted with the guide post 302 is disposed on the accommodation housing 301. The guide post 302 is movably disposed in the accommodation housing 301. The first end 3021 of the guide post 302 extends out of the accommodation housing 301 from the guide hole 3011. The elastic member 303 is located in the accommodation housing 301. The elastic member 303 is configured to be compressed and abut against an inner wall of the accommodation housing 301 when the flexible display module 2 is in the unfolded state. In an example of the present embodiment, an accommodation cavity for accommodating the guide post 302 and the elastic member 303 is formed between the accommodation housing 301 and the first side surface 2021 of the support plate 202, and the shape of the accommodation housing 301 is not limited. The elastic member 303 may be disposed close to a second end 3022 of the guide post 302, one end of the elastic member 303 is fixed on the guide post 302, and the other end of the elastic member 303 is configured to abut against the inner wall of the accommodation housing 301 in the compressed state.

As shown in FIGS. 7 and 8, in some exemplary embodiments, the elastic member 303 is a spring and is sleeved on the guide post 302. The guide post 302 is configured such that the second end 3022 of the guide post 302 extends out of a relief hole 3012 provided on the accommodation housing 301 when the flexible display module 2 is in the unfolded state. The elastic member 303 is configured to be compressed when the flexible display module 2 is in the unfolded state, such that one end of the elastic member 303 abuts against a baffle ring 3023 provided on the guide post 302, and the other end abuts against an inner wall of the accommodation housing 301 where the relief hole 3012 is provided. In an example of the present embodiment, the guide hole 3011 and the relief hole 3012 are provided in two opposite side walls of the accommodation housing 301 respectively. One end of the spring can be fixed on the baffle ring 3023. The initial state (in which the first end 3021 of the guide post 302 does not abut against the position-limiting portion 1023) of the spring may be the natural state, at which point the second end 3022 of the guide post 302 may be located in the relief hole 3012 or may be located in the accommodation housing 301 without contacting the inner wall of the accommodation housing 301, and the other end of the spring may or may not contact the inner wall of the accommodation housing 301.

Figure 6:
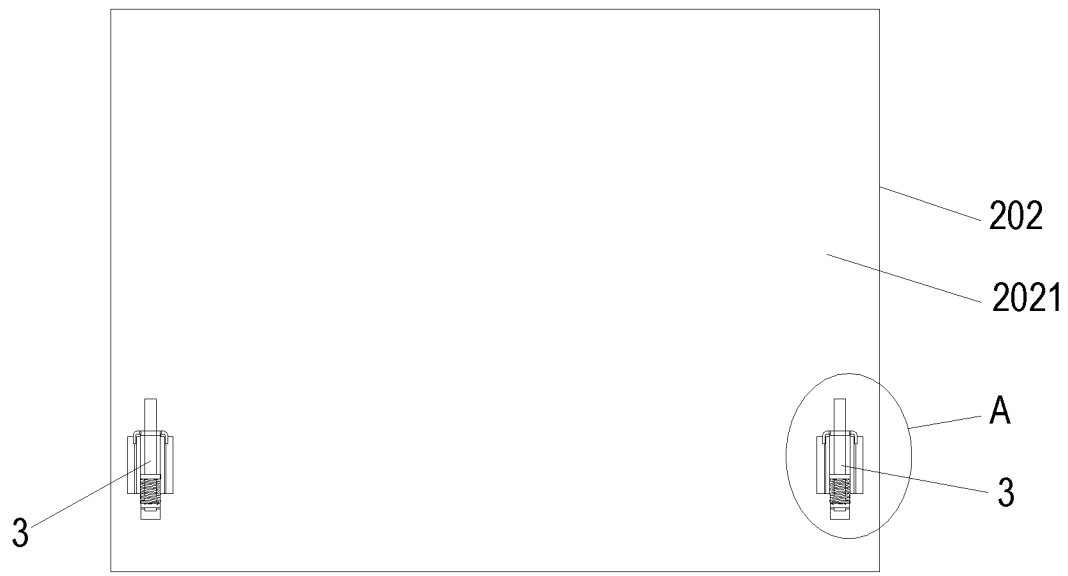
FIG. 6 is a schematic diagram of a connection structure of a support plate and a pull-back device of the foldable display device of FIG. 2 according to some exemplary embodiments.

As shown in FIGS. 6 and 8, in some exemplary embodiments, two pull-back devices 3 and two position-limiting portions 1023 are provided, and the two position-limiting portions 1023 mate with the guide posts 302 of the two pull-back devices 3 respectively. In an example of the present embodiment, the two pull-back devices 3 can be symmetrically arranged on the first side surface 2021 of the support plate 202. Arrangement of the two pull-back devices 3 is conducive to balancing forces exerted to the support plate 202 and ensuring steady and smooth movement of the support plate 202 during sliding. In some exemplary embodiments, more than two pull-back devices 3 and more than two position-limiting portions 1023 may be provided, and the number of the pull-back devices 3 is the same as the number of the position-limiting portions 1023 and the pull-back devices 3 are in one-to-one correspondence with the position-limiting portions 1023.

Figure 10:
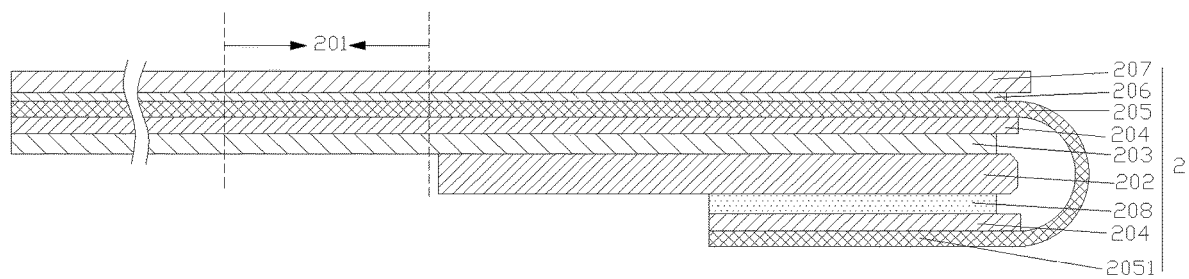
FIG. 10 is a schematic structural sectional view of a flexible display module of a foldable display device according to some exemplary embodiments.

As shown in FIG. 10, in some exemplary embodiments, the flexible display module 2 may be an organic light emitting diode (OLED) flexible display module 2. The flexible display module 2 includes a flexible display panel 205, and the support plate 202 is disposed on one side of the flexible display panel 205 facing away from the display side. The support plate 202 includes the first side surface 2021 facing away from the display side of the flexible display module 2. A binding area 2051 of the flexible display panel 205 is bent to the side of the flexible display module 2 facing away from the display side, and is fixed (may be, but not limited to being, bonded and fixed by a double-sided adhesive tape 208) on the first side surface 2021 of the support plate 202. In the present embodiment, the binding area 2051 (which is configured to be bound and connected to a driving circuit board) of the flexible display panel 205 can be bent to the side of the flexible display module 2 facing away from the display side, which is conducive to narrowing a bezel area of the display module.

As shown in FIG. 10, in some exemplary embodiments, the flexible display module 2 may further include a substrate 203 disposed on the side of the flexible display panel 205 facing away from the display side, and a second side surface of the support plate 202 opposite to the first side surface 2021 is fixed on the substrate 203. In an example of the present embodiment, the substrate 203 may be, but is not limited to, a stainless steel sheet (SUS), for supporting and heat dissipation. In some exemplary embodiments, the flexible display module 2 may further include a back film 204 attached to the side of the flexible display panel 205 facing away from the display side, a polarizer 206 disposed on the display side of the flexible display panel 205 and a cover plate 207. The back film 204 located in a display area of the flexible display panel 205 is fixed on a side of the substrate 203 facing the display side of the flexible display module 2, and the back film 204 located at the binding area 2051 of the flexible display panel 205 can be bonded and fixed on the first side surface 2021 of the support plate 202 by the double-sided adhesive tape 208. A touch structure layer may be arranged on the display side of the flexible display panel 205 using, but not limited to, the flexible multi-layer on cell (FMLOC) touch technology, and the touch structure layer is sequentially covered by the polarizer 206 and the cover plate 207.

Based on contents described above, an embodiment of the present application further provides a flexible display assembly, as shown in FIGS. 2 to 5, the flexible display assembly is configured to be assembled with the casing frame 1 of the foldable display device. The flexible display assembly includes a flexible display module 2 and a pull-back device 3 (shown in FIG. 5). The flexible display module 2 includes a bending area 201, the bending area 201 is configured to have the bent shape when the flexible display module 2 is in the folded state. As shown in FIG. 10, the flexible display module 2 includes a flexible display panel 205, a substrate 203 disposed on the side of the flexible display panel 205 facing away from the display side, and a support plate 202 fixed on the side of the substrate 203 facing away from the display side of the flexible display panel 205. The support plate 202 is located on one side of the bending area 201 and arranged close to the first end of the flexible display module 2. The support plate 202 is configured to be slidably connected to the casing frame 1, and a portion of the flexible display module 2 close to the second end is configured to be fixedly connected to the casing frame 1. The pull-back device 3 is disposed on the support plate 202 and is configured to cooperate with the casing frame 1 to exert a force on the flexible display module 2 to flatten the bending area 201 when the flexible display module 2 is in the unfolded state.

In some exemplary embodiments, as shown in FIGS. 2 to 5, the casing frame 1 includes a first frame body 101 and a second frame body 102 hinged with the first frame body 101, and a hinged portion 103 between the first frame body 101 and the second frame body 102 corresponds to the bending area 201 of the flexible display module 2. The second frame body 102 includes two second bezels 1021 opposite to each other, and two sides of the support plate 202 are respectively slidably disposed in chutes 1022 (shown in FIG. 2) provided on the two second bezels 1021. The first frame body 101 includes two first bezels 1011 opposite to each other and a fixed plate 1012 arranged between the two first bezels 1011. The two first bezels 1011 are hinged with the two second bezels 1021 respectively, and the portion close to the second end on the side of the flexible display module 2 facing away from the display side is fixed (may be bonded and fixed by a double-sided adhesive tape) on the fixed plate 1012.

In some exemplary embodiments, as shown in FIGS. 5 to 8, the support plate 202 includes the first side surface 2021 facing away from the display side of the flexible display module 2, and the pull-back device 3 includes a guide portion 309 and an abutting portion 310 arranged on the first side surface 2021 of the support plate 202, a guide post 302 slidably fitted with the guide portion 309, and an elastic member 303 arranged on the guide post 302. The guide post 302 is configured to abut against the casing frame 1 when the flexible display module 2 is in the unfolded state, and the elastic member 303 is configured to be compressed and abut against the abutting portion 310 when the flexible display module 2 is in the unfolded state.

In some exemplary embodiments, as shown in FIG. 10, the support plate 202 includes the first side surface facing away from the display side of the flexible display module 2, and the flexible display panel 205 includes a display area and a binding area 2051 located at one side of the display area. The binding area 2051 is bent to the side of the flexible display module 2 facing away from the display side and fixed (may be bonded and fixed by the double-sided adhesive tape 208) on the first side surface of the support plate 202.

Figure 11:
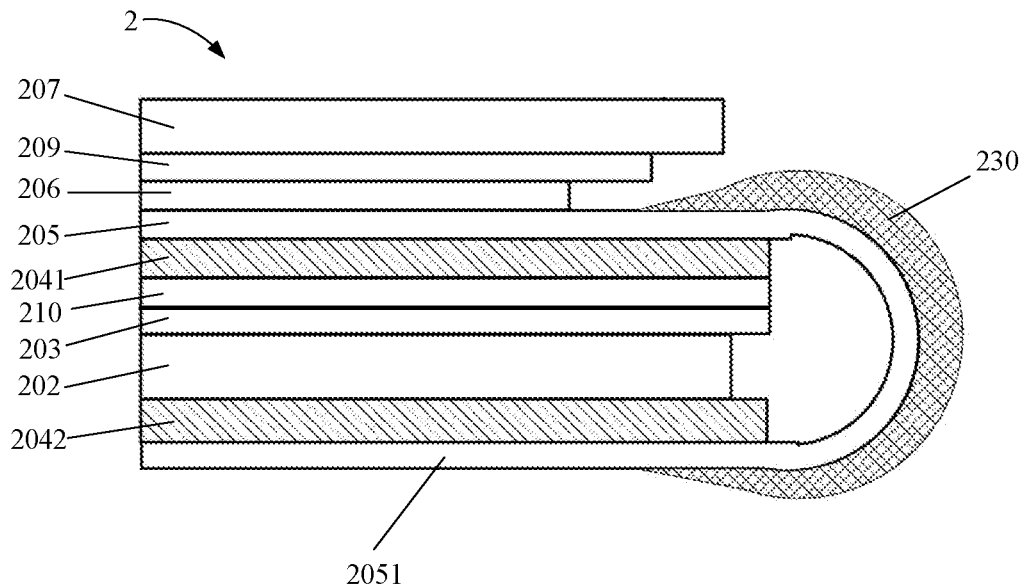
FIG. 11 is a schematic partial structural sectional view of a flexible display module of a foldable display device according to some other exemplary embodiments.
Figure 12:
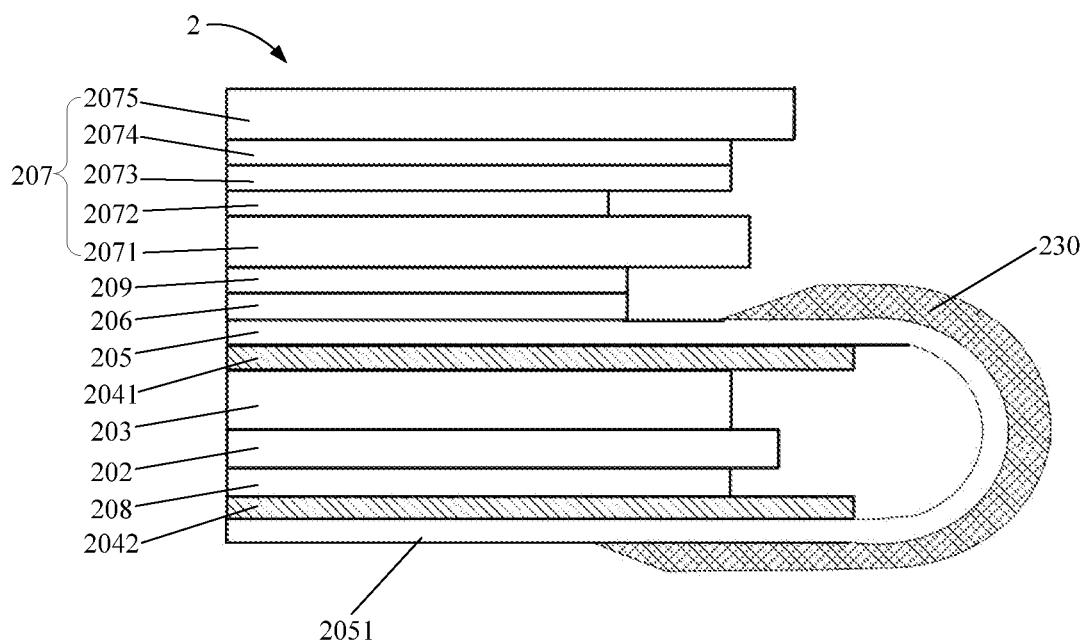
FIG. 12 is a schematic partial structural sectional view of a flexible display module of a foldable display device according to yet some other exemplary embodiments.

In an example of the present embodiment, as shown in FIGS. 11 and 12, a material of the substrate 203 may include any one or more of stainless steel, copper and aluminum, for example, the material of the substrate 203 is stainless steel. The substrate 203 made of metal can play a role in improving creases of the flexible display module 2, and can also play a role in supporting, heat dissipation, and assembly and fixation with the casing frame 1. The flexible display module 2 may further include a first back film 2041 disposed on a side of the display area of the flexible display panel 205 facing away from the display side, a second back film 2042 located in the binding area 2051 and fixed on the first side surface of the support plate 202, a flexible support layer 210 arranged between the first back film 2041 and the substrate 203, and a polarizer 206 and a cover plate 207 stacked on the display side of the flexible display panel 205.

In an example, the second back film 2042 may be fixed on the first side surface of the support plate 202 by the double-sided adhesive tape 208 (shown in FIG. 12). The flexible display panel 205 further includes a bending area located between the display area and the binding area 2051. An outer surface of the bending area may be coated with a protective adhesive 230, the protective adhesive 230 may be an ultraviolet curable protective adhesive (such as micro coating layer (MCL) adhesive) or polyester polyurethane adhesive, etc., so that a metal wiring layer of the bending area is located in a neutral layer in a process of bending the binding area 2051 to the side of the flexible display module 2 facing away from the display side (the metal wiring layer is not stretched or compressed during the bending), so as to prevent metal wiring in the bending area from breaking during the bending.

In an example, a material of the flexible support layer may include foam, or a material of the flexible support layer may include any one or more of polyethylene terephthalate (PET), polyimide (PI), polyethylene (PE), polypropylene (PP), polystyrene (PS) and polyethylene naphthalate (PEN). The flexible support layer can play a role in supporting and protection for the flexible display panel 205.

In an example, adhesive layers, which may be optically clear adhesive (OCA), may be bonded between the polarizer 206 and the cover plate 207, as well as between the polarizer 206 and the flexible display panel 205. FIGS. 11 and 12 show a first adhesive layer 209 between the polarizer 206 and the cover plate 207. The cover plate 207 may have a single-layer structure and may be made of a flexible material such as transparent polyimide, as shown in FIG. 11. Alternatively, the cover plate 207 may have a multi-layer structure, for example, the cover plate 207 may include a first cover plate 2071, a second cover plate 2073 and a third cover plate 2075 which are stacked from bottom to top in sequence, wherein a second adhesive layer 2072 may be bonded between the first cover plate 2071 and the second cover plate 2073 and a third adhesive layer 2074 may be bonded between the second cover plate 2073 and the third cover plate 2075, as shown in FIG. 12. Both the first cover plate 2071 and the third cover plate 2075 may be made of a flexible material such as transparent polyimide, the second cover plate 2073 may be Ultra Thin Glass (UTG), and both the second adhesive layer 2072 and the third adhesive layer 2074 may be optically clear adhesive (OCA). The cover plate 207 with the multi-layer structure in this example may have good impact resistance and resilience.

In some exemplary embodiments, a material of the support plate 202 may include any one or more of stainless steel, copper and aluminum. For example, the support plate 202 is made of stainless steel. The support plate 202 made of metal material is conducive to assembly with the casing frame 1, and can play a role in heat dissipation.

In the description herein, unless otherwise specified and defined explicitly, the terms "connection", "fixed connection", "installation" and "assembly" should be understood in a broad sense. For example, it may be a fixed connection, a detachable connection, or an integral connection. The terms "installation", "connection" and "fixed connection" may refer to a direct connection, an indirect connection through an intermediary, or an internal communication between two elements. Those of ordinary skills in the art can understand the meanings of the above terms herein.

What is claimed is:

1. A foldable display device, comprising a casing frame, a flexible display module arranged on the casing frame, and a pull-back device;
    wherein:
    the casing frame comprises a first and a second frame body hinged with the first frame body, and a hinged portion between the first and the second frame body corresponds to a bending area of the flexible display module;
    a support plate is arranged on one side of the flexible display module facing away from a display side, the support plate is arranged close to a first end of the flexible display module and is slidably connected to the second frame body, and a portion of the flexible display module close to a second end is fixed on the first frame body;
    the pull-back device is arranged between the support plate and the second frame body, and is configured to exert a force on the flexible display module for flattening the bending area of the flexible display module when the flexible display module is in an unfolded state;
    the support plate comprises a first side surface facing away from the display side of the flexible display module, and the pull-back device comprises a guide portion and an abutting portion arranged on the first side surface of the support plate, a guide post slidably fitted with the guide portion, and an elastic member arranged on the guide post;
    a position-limiting portion is arranged on the second frame body, and is configured to abut against a first end of the guide post when the flexible display module is in the unfolded state; and
    the elastic member is configured to be compressed and abut against the abutting portion when the flexible display module is in the unfolded state.

2. The foldable display device according to claim 1, wherein the second frame body comprises two second bezels opposite to each other, and two sides of the support plate are respectively slidably arranged in chutes provided on the two second bezels.

3. The foldable display device according to claim 2, wherein the first frame body comprises two first bezels opposite to each other and a fixed plate arranged between the two first bezels, the two first bezels are hinged with the two second bezels respectively, and a portion close to the second end on a side of the flexible display module facing away from the display side is fixed on the fixed plate.

4. The foldable display device according to claim 2, wherein a chute is configured such that one end of the chute abuts against an end of the support plate when the flexible display module is in a folded state.

5. The foldable display device according to claim 1, wherein the pull-back device comprises an accommodation housing arranged on the first side surface of the support plate, the accommodation housing comprises the guide portion and the abutting portion, a guide hole slidably fitted with the guide post is disposed on the accommodation housing, the guide post is movably disposed in the accommodation housing, and the first end of the guide post extends out of the accommodation housing from the guide hole; and
    the elastic member is located in the accommodation housing, the elastic member is configured to be compressed and abut against an inner wall of the accommodation housing when the flexible display module is in the unfolded state.

6. The foldable display device according to claim 5, wherein the elastic member is a spring and is sleeved on the guide post;
    the guide post is configured such that a second end of the guide post extends out of a relief hole provided on the accommodation housing when the flexible display module is in the unfolded state; and
    the elastic member is configured to be compressed when the flexible display module is in the unfolded state, such that one end of the elastic member abuts against a baffle ring provided on the guide post, and the other end of the elastic member abuts against the inner wall of the accommodation housing where the relief hole is provided.

7. The foldable display device according to claim 1, wherein two pull-back devices and two position-limiting portions are provided, and the two position-limiting portions mate with guide posts of the two pull-back devices respectively.

8. The foldable display device according to claim 1, wherein the flexible display module comprises a flexible display panel, the support plate is arranged on one side of the flexible display panel facing away from the display side, and the support plate comprises a first side surface facing away from the display side of the flexible display module; and
   a binding area of the flexible display panel is bent to one side of the flexible display module facing away from the display side and fixed on the first side surface of the support plate.

9. The foldable display device according to claim 8, wherein the flexible display module further comprises a substrate disposed on the side of the flexible display panel facing away from the display side, and a second side surface of the support plate opposite to the first side surface is fixed on the substrate.

10. A flexible display assembly configured to be assembled with a casing frame of a foldable display device, wherein:
   the flexible display assembly comprises a flexible display module and a pull-back device, the flexible display module comprises a bending area which is configured to have a bent shape when the flexible display module is in a folded state;
   the flexible display module comprises a flexible display panel, a substrate arranged on one side of the flexible display panel facing away from a display side, and a support plate fixed on a side surface of the substrate facing away from the display side of the flexible display panel; the support plate is located on one side of the bending area and is arranged close to a first end of the flexible display module, the support plate is configured to be slidably connected to the casing frame, and a portion of the flexible display module close to a second end is configured to be fixedly connected to the casing frame;
   the pull-back device is arranged on the support plate and is configured to cooperate with the casing frame to exert a force on the flexible display module for flattening the bending area when the flexible display module is in an unfolded state; and
   the support plate comprises a first side surface facing away from the display side of the flexible display module, and the pull-back device comprises a guide portion and an abutting portion arranged on the first side surface of the support plate, a guide post slidably fitted with the guide portion, and an elastic member arranged on the guide post, the guide post is arranged to abut against the casing frame when the flexible display module is in the unfolded state, and the elastic member is configured to be compressed and abut against the abutting portion when the flexible display module is in the unfolded state.

11. The flexible display assembly according to claim 10, wherein the support plate comprises a first side surface facing away from the display side of the flexible display module, the flexible display panel comprises a display area and a binding area located at one side of the display area, and the binding area is bent to one side of the flexible display module facing away from the display side and fixed on the first side surface of the support plate.

12. The flexible display assembly according to claim 11, wherein a material of the substrate comprises any one or more of stainless steel, copper and aluminum, and the flexible display module further comprises a first back film disposed on a side surface of the display area of the flexible display panel facing away from the display side, a second back film located at the binding area and fixed on the first side surface of the support plate, a flexible support layer arranged between the first back film and the substrate, and a polarizer and a cover plate stacked on the display side of the flexible display panel.

13. The flexible display assembly according to claim 12, wherein a material of the flexible support layer comprises foam, or a material of the flexible support layer comprises any one or more of polyethylene terephthalate, polyimide, polyethylene, polypropylene, polystyrene and polyethylene naphthalate.

14. The flexible display assembly according to claim 10, wherein a material of the substrate comprises any one or more of stainless steel, copper and aluminum; or/and a material of the support plate comprises any one or more of stainless steel, copper and aluminum.

15. The foldable display device according to claim 2, wherein the support plate comprises a first side surface facing away from the display side of the flexible display module, and the pull-back device comprises a guide portion and an abutting portion arranged on the first side surface of the support plate, a guide post slidably fitted with the guide portion, and an elastic member arranged on the guide post;
   a position-limiting portion is arranged on the second frame body, and is configured to abut against a first end of the guide post when the flexible display module is in the unfolded state; and
   the elastic member is configured to be compressed and abut against the abutting portion when the flexible display module is in the unfolded state.

16. The foldable display device according to claim 3, wherein the support plate comprises a first side surface facing away from the display side of the flexible display module, and the pull-back device comprises a guide portion and an abutting portion arranged on the first side surface of the support plate, a guide post slidably fitted with the guide portion, and an elastic member arranged on the guide post;
   a position-limiting portion is arranged on the second frame body, and is configured to abut against a first end of the guide post when the flexible display module is in the unfolded state; and
   the elastic member is configured to be compressed and abut against the abutting portion when the flexible display module is in the unfolded state.

17. The foldable display device according to claim 4, wherein the support plate comprises a first side surface facing away from the display side of the flexible display module, and the pull-back device comprises a guide portion and an abutting portion arranged on the first side surface of the support plate, a guide post slidably fitted with the guide portion, and an elastic member arranged on the guide post;
   a position-limiting portion is arranged on the second frame body, and is configured to abut against a first end of the guide post when the flexible display module is in the unfolded state; and
   the elastic member is configured to be compressed and abut against the abutting portion when the flexible display module is in the unfolded state.

18. The foldable display device according to claim 15, wherein the pull-back device comprises an accommodation housing arranged on the first side surface of the support plate, the accommodation housing comprises the guide portion and the abutting portion, a guide hole slidably fitted with the guide post is disposed on the accommodation housing, the guide post is movably disposed in the accommodation housing, and the first end of the guide post extends out of the accommodation housing from the guide hole; and the elastic member is located in the accommodation housing, the elastic member is configured to be compressed and abut against an inner wall of the accommodation housing when the flexible display module is in the unfolded state.

\* \* \* \* \*